United States Patent
London et al.

(10) Patent No.: US 8,744,004 B2
(45) Date of Patent: Jun. 3, 2014

(54) HIGH POWER PULSE GENERATOR

(75) Inventors: Simon Y. London, Rockville, MD (US); Alexander Kozyrev, Rockville, MD (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 657 days.

(21) Appl. No.: 13/072,153

(22) Filed: Mar. 25, 2011

(65) Prior Publication Data

US 2011/0235742 A1 Sep. 29, 2011

Related U.S. Application Data

(60) Provisional application No. 61/317,772, filed on Mar. 26, 2010.

(51) Int. Cl.
*H04L 27/00* (2006.01)

(52) U.S. Cl.
USPC ............................ 375/299; 375/238; 375/239

(58) Field of Classification Search
USPC .................... 375/238, 239, 299, 353
See application file for complete search history.

(56) References Cited

U.S. PATENT DOCUMENTS

| | | | |
|---|---|---|---|
| 5,249,186 A * | 9/1993 | Remson | 714/809 |
| 6,121,853 A | 9/2000 | London | |
| 6,472,950 B1 | 10/2002 | London | |
| 7,227,280 B2 | 6/2007 | Zucker et al. | |
| 7,268,641 B2 | 9/2007 | Zucker et al. | |
| 7,365,615 B2 | 4/2008 | Zucker et al. | |
| 7,518,464 B2 | 4/2009 | London | |
| 7,583,159 B2 | 9/2009 | London | |
| 7,583,160 B2 | 9/2009 | London | |
| 7,633,182 B2 | 12/2009 | London | |
| 7,692,509 B2 | 4/2010 | London | |
| 7,839,232 B2 | 11/2010 | London | |
| 2003/0156774 A1 * | 8/2003 | Conradi | 385/2 |
| 2005/0145699 A1 | 7/2005 | Zucker et al. | |
| 2006/0061431 A1 | 3/2006 | London | |
| 2006/0279372 A1 | 12/2006 | Zucker et al. | |
| 2007/0040623 A1 | 2/2007 | London | |
| 2007/0165839 A1 | 7/2007 | London | |
| 2007/0273458 A1 * | 11/2007 | Pepper et al. | 333/167 |
| 2008/0007356 A1 | 1/2008 | Zucker et al. | |
| 2008/0224794 A1 | 9/2008 | London | |
| 2009/0167453 A1 | 7/2009 | London | |
| 2009/0284323 A1 | 11/2009 | London | |
| 2010/0001807 A1 | 1/2010 | London et al. | |
| 2010/0026101 A1 | 2/2010 | London | |
| 2010/0194208 A1 | 8/2010 | London | |
| 2010/0231278 A1 | 9/2010 | London | |
| 2010/0231318 A1 | 9/2010 | London | |

* cited by examiner

*Primary Examiner* — Curtis Odom
(74) *Attorney, Agent, or Firm* — Sand & Sebolt, LPA; Daniel J. Long

(57) ABSTRACT

A systems, pulse generators, apparatus and methods for generating a high power signal are presented. A pulse generator includes a generator and a modulator unit. The generator generates a bipolar signal. The modulator unit modulates the bipolar signal with oscillating signals to generate a modulated bipolar signal with oscillating portions. The frequency spectrum of the modulated bipolar signal contains very little to no direct current (DC) component.

18 Claims, 6 Drawing Sheets

HIGH POWER PULSE GENERATOR

CROSS REFERENCE TO RELATED APPLICATION

This application claims priority from U.S. Provisional Patent Application Ser. No. 61/317,772 filed Mar. 26, 2010; the disclosure of which is incorporated herein by reference.

BACKGROUND OF THE INVENTION

1. Field of Invention

The current invention relates generally to apparatus, systems and methods for generating radio frequency signals. More particularly, the apparatus, systems and methods relate to generating high power radio frequency (RF) pulses or high power microwave pulses. Specifically, the apparatus, systems and methods provide for generating a high power RF or microwave pulse based on a bipolar signal driver.

2. Description of Related Art

Various techniques based on different types of modulators of low frequency signals have been proposed as sources of RF or microwave radiation. The most successful implementations of this concept in high power microwave (HPM) systems to date have been realized by employing various types of nonlinear transmission lines (NLTLs) with dispersion. NLTLs have traditionally been used in high power microwave circuits for generating short transients, as discussed, for example, in I. G. Kataev, *Electromagnetic Shock Waves*. London: Illife, 1966. Recently, the possibility of the direct conversion (modulation) of a flat top "video" pulse into an RF Ise during its propagation along a NLTL with dispersion has been considered in several articles and a patent A. M. Belyantsev, et. al. *Technical Physics,* 40, 820-6 (1995); 43, 80-85 (1998); 45, 747-752 (2000); A. M. Belyantsev and A. B. Kozyrev, International Journal of Infrared and Millimeter Waves, vol. 23, no. 10, pp. 1475-1500, October 2002; H. Ikezi, J. S. DeGrassie, and J. Drake, Applied Physics Letters, 58, 986-7, (1991); N. Seddon, et. al. 2007 IEEE Pulsed Power Conf. Proc., p. 678; N. Seddon and J. Dolan, U.S. Pat. No. 7,498,978 B2; and V. P. Gubanov, et. Al. Technical Physics Letters, vol. 35, no. 7, pp. 626-628 (2009). These techniques are based on the synchronous excitation of RF waves by an electromagnetic shock wave (EMSW) front. NLTLs capable of producing modulation of a video pulse can be implemented either with nonlinear inductances (for example ferrites or other magnetic nonlinear materials) or nonlinear capacitors (nonlinear dielectrics, pin diodes, Schottky diodes, etc.) or both of them as well as with different types of dispersion. For instance, a technique proposed and developed in A. M. Belyantsev, et. al. *Technical Physics,* 40, 820-6 (1995); 43, 80-85 (1998); 45, 747-752 (2000) and A. M. Belyantsev and A. B. Kozyrev, International Journal of Infrared and Millimeter Waves, vol. 23, no. 10, pp. 1475-1500, October 2002 and experimentally demonstrated in N. Seddon, et. al. 2007 IEEE Pulsed Power Conf. Proc., p. 678. employs NLTLs with spatial dispersion introduced by capacitance cross links and with nonlinearity introduced by saturable inductance of ferrite material, in which magnetization reversal occurs incoherently in strong fields and can be described by the Gyorgy model in E. M. Gyorgy, J. Appl. Phys., vol. 28, no. 9 (1957). Similar approaches can be implemented employing nonlinear dielectric materials. Furthermore, the technique described in U.S. Pat. No. 7,498,978 B2 and V. P. Gubanov, et. Al. Technical Physics Letters, vol. 35, no. 7, pp. 626-628 (2009) takes advantage of temporal dispersion arising during coherent gyromagnetic magnetization rotation in axially magnetized ferrite materials placed into a coaxial line.

Known high power RF and/or microwave pulse generators based on nonlinear transmission line modulators typically use high voltage unipolar pulses (for example video or rectangular pulse generators) as pump pulse generators. Typically, video pulse generators are implemented as high-voltage Blumlein generators. A resulting output pulse consists of damped RF or microwave sinusoid with direct current (dc) and very low frequency components associated with original video pulse. The energy stored in these direct current and very low frequency components is useless (cannot be radiated). Since the portion of energy stored in these components substantially exceeds the energy stored in RF components, the radiating efficiency of system is very low. Furthermore, the pulse repetition rate is limited by thermal and cooling issues, as well as the charge rate available into the high voltage video pulse generator. Moreover, high-voltage Blumlein generators that usually employ spark-gap switches cannot be recharged in a short time period (sub-nanosecond range). Therefore, it is generally not possible in an existing system based on NLTL modulators to generate a train of damped sinusoids to provide high output energy in short period of time. A need, therefore, exists for a high power pulse generator with a high efficiency.

SUMMARY OF THE INVENTION

The preferred embodiment of the invention includes a pulse generator for generating a high power pulse. The high power pulse can be either a radio frequency signal or a microwave signal. The pulse generator includes a generator and a modulator unit. The generator generates a bipolar signal. The modulator unit modulates the bipolar signal with oscillating signals to generate a modulated bipolar signal with oscillating pulses. The frequency spectrum of the modulated bipolar signal contains very little to no direct current (DC) components.

In another configuration of the preferred embodiment, the generator is configured to generate the bipolar signal that is a one cycle bipolar signal that includes a generally rectangular positive pulse with positive amplitude and a generally rectangular pulse with negative amplitude. The generally rectangular positive pulse rises from zero volts to generally a voltage with a positive amplitude of $V_1$ for a time period of T2, then returns to zero volts. The generally rectangular negative pulse falls from zero volts to a negative amplitude $V_2$ for a time period of T2, and then returns to zero volts. The negative and positive pulses can be sequential or may be separated from each other for by time period of T3. The generator can be configured to generate a bipolar signal that includes two or more of the one cycle bipolar signals generated sequentially with or without a time delay between them.

In at least one configuration, the preferred embodiment includes a non-linear transmission line (NLTL). The NLTL modulates the bipolar signal with oscillating signals to generate the modulated bipolar signal.

In some configurations of the preferred embodiment, the pulse generator includes first and second antennas and a diplexer. The first antenna operates at a first bandwidth and the second antenna operates at a second bandwidth. The diplexer transmits modulated bipolar signals that are to operate in the first bandwidth to the first antenna and transmits modulated bipolar signals that are to operate in the second bandwidth to the second antenna.

Another configuration of the preferred embodiment is a method for generating a high power pulse. The method begins by generating a bipolar signal. The bipolar signal is modulated with oscillating signals to produce a modulated signal that has very little to no DC component. The modulated signal is transmitted out of one or more antennas.

Another configuration of the preferred embodiment includes routing a bipolar signal to a first NLTL. The first NLTL produces the modulated signal that is a first modulated signal. The bipolar signal is also routed to a second NLTL to produce a second modulated signal. The first modulated signal and the second modulated signal are then transmitted from two different antennas that form at least part of an antenna array.

Another configuration of the preferred embodiment relates to an NLTL-based RF or microwave generator which would produce little to no direct current component and associated low frequency components at the generator output (at the antenna input) thus improving the efficiency of the system and increasing the output energy in short period of time by generating a train of oscillating bipolar sinusoids.

According to the preferred embodiment, a high-voltage single- or multi-cycle bipolar pulse(s) generator is used with (or without) a specified time delay(s) between positive and negative sub-pulses instead of a unipolar pump generator (driver) like a Blumlein generator, for example. The direct current and very low frequency components will therefore be absent from the very beginning (at the pump stage) and, as a result, the output (radiated) energy and efficiency will be increased substantially over prior art pulse generators.

BRIEF DESCRIPTION OF SEVERAL VIEWS OF THE DRAWINGS

One or more preferred embodiments that illustrate the best mode(s) are set forth in the drawings and in the following description. The appended claims particularly and distinctly point out and set forth the invention.

The accompanying drawings, which are incorporated in and constitute a part of the specification, illustrate various example methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Similar numbers refer to similar parts throughout the drawings.

DETAILED DESCRIPTION

Figure 1:
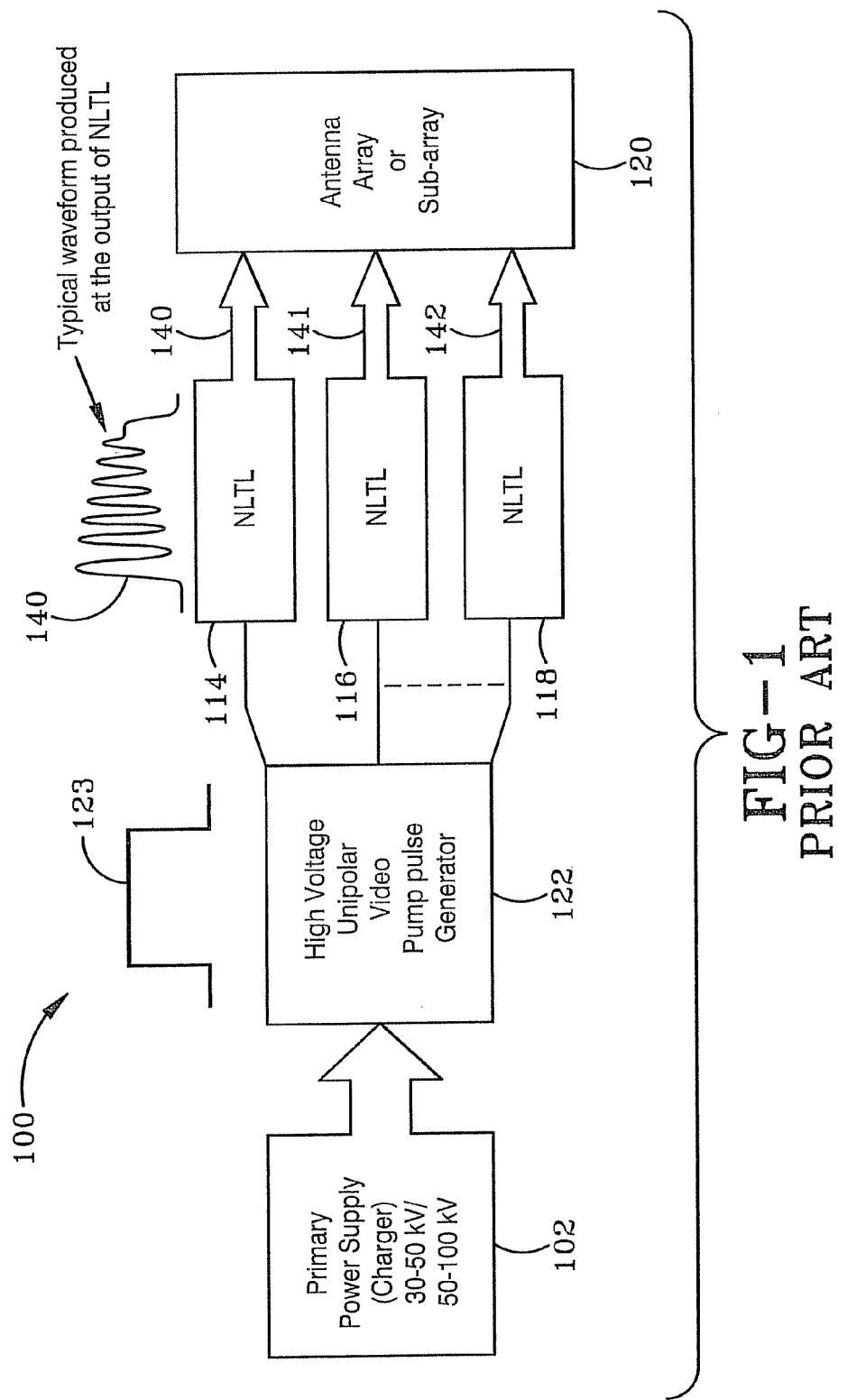
FIG. 1 illustrates a prior art NLTL based RF pulse generator.
Figure 2:
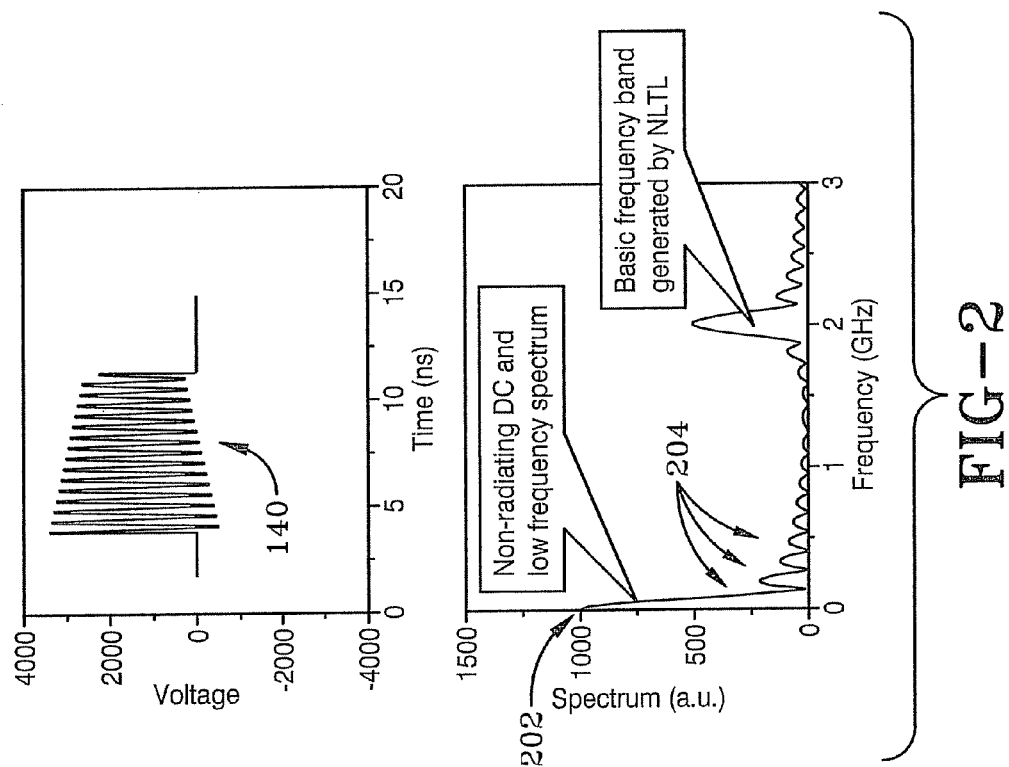
FIG. 2 illustrates example voltage and spectral plots of the prior art NLTL based RF pulse generator with direct current (DC) and low frequency components.

FIG. 1 illustrates an exemplary prior art system 100. The system 100 includes a primary power supply 102 to power a high voltage unipolar pulse pump generator 122 (for example, Blumlein pulse generator) to generate a unipolar signal 123. The signal 123 is provided to an array of NLTL modulators 114, 116 and 118. The NLTLs 114, 116 and 118 produce corresponding unipolar dampened sinusoidal outputs 140, 141 and 142. These outputs 140, 141 and 142 are input to an antenna array or sub-array 120. As shown in FIG. 2, the frequency spectrum of these outputs 140, 141 and 142 have a rather large DC component 202 as well as low frequency components 204.

Figure 3:
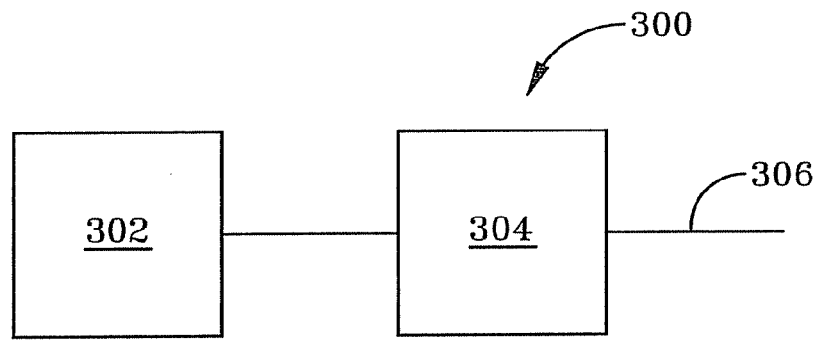
FIG. 3 illustrates an example functional diagram of a preferred embodiment of a RF or microwave pulse generating system.

FIG. 3 illustrates the preferred embodiment of the invention in a first configuration as a pulse generator 300. This pulse generate 300 can be used to generate high power microwave pulses and/or high power radio frequency pulses. The pulse generator 300 includes a generator 302 and a modulator unit 304. The generator 302 generates a bipolar signal or two or more cycles of bipolar signals (e.g., waveforms). These bipolar signal(s) may be similar to one or more of the bipolar signal(s) 470, 471, 472 and 473 of FIG. 4. The rise and fall times of the bipolar signal(s) can be around 100 pico seconds and up to several nano seconds.

Figure 5:
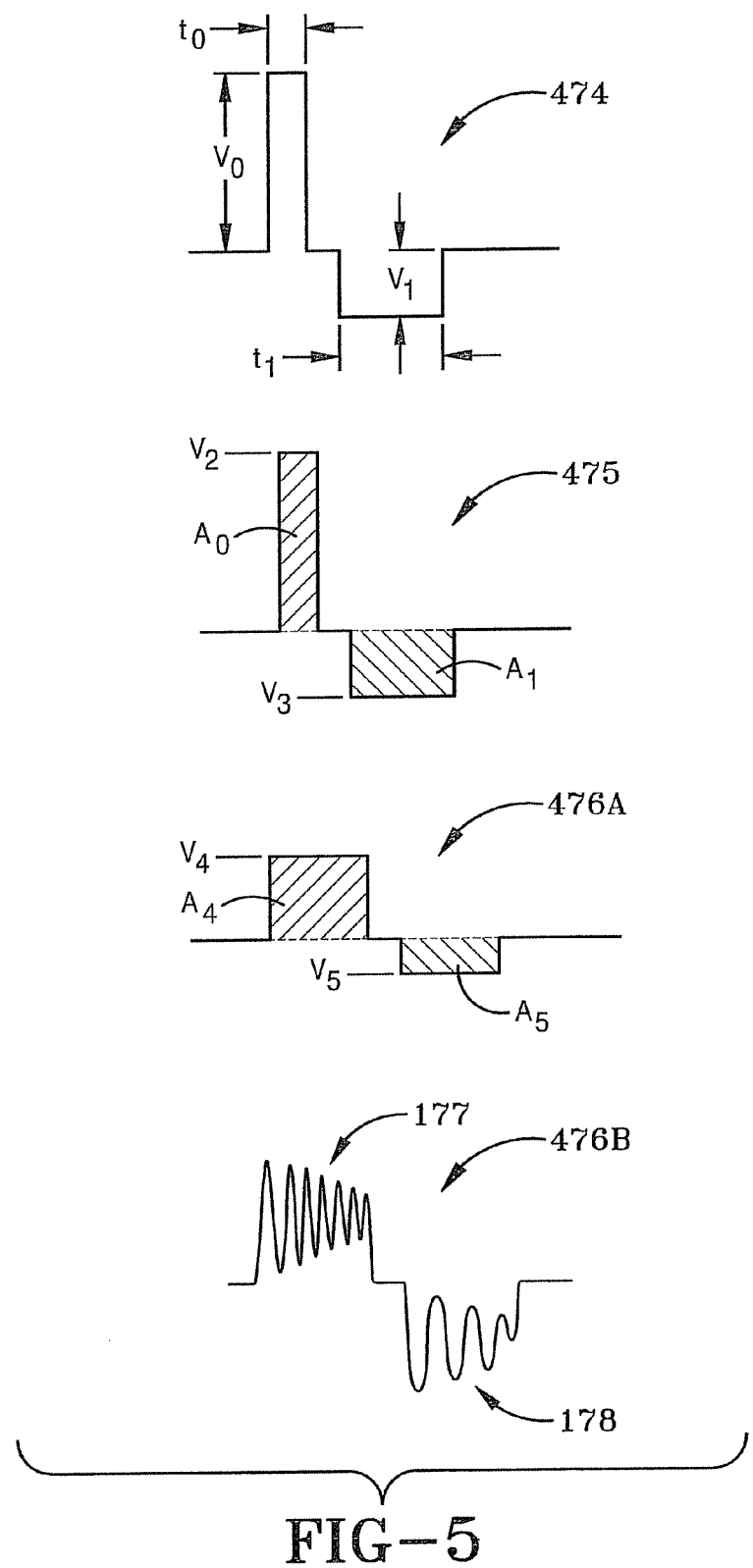
FIG. 5 illustrates example bipolar non-symmetrical signals generated by a generator of the preferred embodiment of a pulse generating system.

FIG. 5 illustrates other possible bipolar signals 474, 475 and 476A that can be generated by the generator 302. Unlike signals 470, 471, 472 and 473, the positive and negative portions of these signals (474, 475 and 476A) are not symmetrical. For example, signal 474 rises to a positive voltage of $V_o$ and falls to a negative voltage of $V_1$ where the magnitude of $V_o$ is about twice as great as the magnitude of $V_1$. Additionally, the duration of $V_o$ is $t_o$ seconds and the duration of $V_1$ is $t_1$ second which is about twice as long as $t_o$. As illustrated by signal 475 (FIG. 5), the area $A_o$ defined by $V_1$ is generally equal to the area $A_1$ a defined by $V_3$. Of course, these areas $A_o$, $A_1$ can be different in other configurations of the preferred embodiment as understood by those of ordinary skill in this art.

Returning to FIG. 3, the modulator unit 304 modulates the bipolar signal(s) with oscillating pulses to generate a modulated bipolar signal(s) with oscillating pulses. The modulated bipolar signal(s) may be similar to one or more of the modulated bipolar signal(s) 481, 482, 483 and 484 of FIG. 4 or the modulated bipolar signal 476B of FIG. 5. Because the amplitude of $V_4$ (FIG. 5) is different than the amplitude of $V_5$, the frequency of the portion 177 of modulated bipolar signal 176A associated with voltage $V_4$ has a higher frequency than the portion 178 of modulated bipolar signal 176A associated with voltage $V_5$. The frequency spectrum of the modulated bipolar signals contains very little or does not contain a direct current (DC) component. Additionally, as shown in FIG. 6, the frequency spectrum of the modulated bipolar signals have a primary frequency 602 and a second frequency 604 above a threshold $S_{a.u.}$, with other frequencies below the threshold, $S_{a.u.}$.

Figure 4:
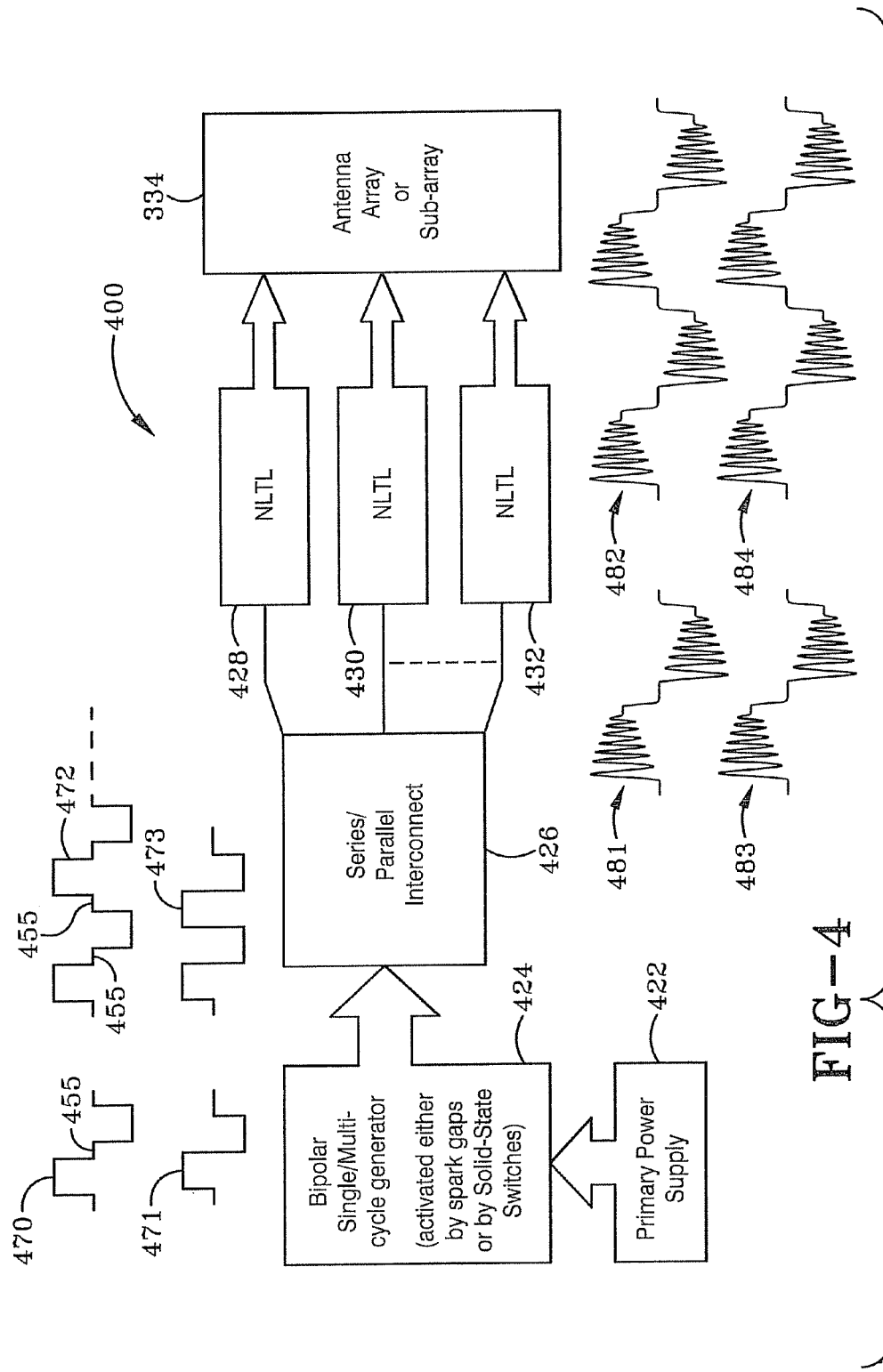
FIG. 4 illustrates a second example configuration of a preferred embodiment of a RF or microwave pulse generating system.

FIG. 4 illustrates another configuration of the preferred embodiment configured as a system 400 for generating high energy pulses. The system 400 includes a primary power supply 422 used to charge a bipolar single/multi-cycle generator 424. The bipolar single/multi-cycle generator 424 serves as a driver for a series/parallel interconnect 426 and an array of NLTLs 428, 430 and 432. Those or ordinary skill in the art will appreciate that the bipolar single/multi-cycle generator 424 may be activated either by spark gap(s) or by a solid state switch(s). The signal from the bipolar driver 424 may or may not have time delays 455 between half-cycles as shown in FIG. 4. For example, signals 470 and 472 have time dealys 455 while signals 471 and 473 do not. The gaps 455 between cycles may be necessary for proper operation of some types of NLTLs. They are required to set the initial condition of nonlinear materials (for example, initial magnetization of ferrites).

The signal from the bipolar single/multi-cycle generator 424 is transmitted through the series/parallel interconnected 426 and then through the array of NLTLs 428, 430, and 432 to an antenna array or sub-array 434. The array of NLTLs 428, 430, and 432 modulates each cycle of the bipolar pump pulse with oscillating signals to create dampened oscillating bipolar pulses similar to example outputs 481, 482, 483 and 484. Based on these oscillating signals, energy transferred to antenna array or sub-array 334 contains the high frequency component associated with the oscillating bipolar signals produced by the NLTL modulators 428, 430 and 432 and middle frequency components associated with the drive bipolar pulse. The resulting pulses 481, 482, 483 and 484 do not contain a direct current (dc) component or very low frequency components that were unwanted (e.g., useless) signals in the prior art system 100 of FIG. 1. In contrast to the prior art, the energy of the pump signal which is not converted into high frequency range by NLTL modulators 428, 430 and 432 is not lost but can be used together with the main frequency produced by NLTL modulators 428, 430 and 432. In contrast to prior art pulse generators, the resulting energy efficiency of the preferred embodiment configured as a dual (multi)-band structure 400 is very high.

Figure 6:
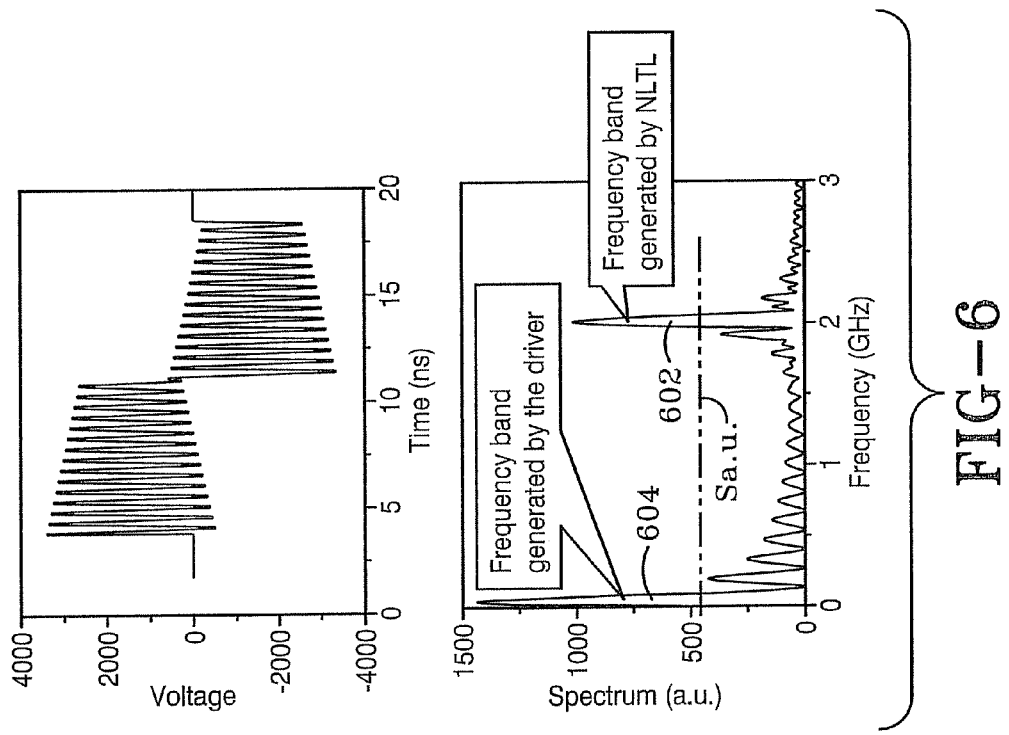
FIG. 6 illustrates example voltage and spectral plots of the preferred embodiment of a pulse generator system without direct current (DC) and reduced low frequency components.

As previously mentioned, FIGS. 2 and 6 respectively illustrate typical Fast Fourier Transform (FFT) of the generated signals at the output of the prior art system 100 shown in FIG. 1 and the preferred embodiment configured as the system shown in FIG. 4. In the spectrum of the signal generated by the preferred embodiment configured as the system 400 of FIG. 4, the basic frequency band generated by NLTLs, 428, 430 and 432 is similar to that for a prior art system 100 of FIG. 1. However, instead of high energy dc 202 and low-frequency components 204 of the prior art system 100, there is an additional high energy middle frequency component 604 that could be used as an operational frequency simultaneously with a high-frequency component 602. This dual frequency bands operation can be important for various applications. For instance, new high power microwave (HPM) electronic warfare (EW) weapon systems could knock out multiple targets and different frequencies with a single unit (half the cost and space taken). Furthermore, higher energy on the target (in a short period of time) due to multicycle operation could allow the HPM system to knock out targets that are farther away from the EW weapon system.

Figure 7:
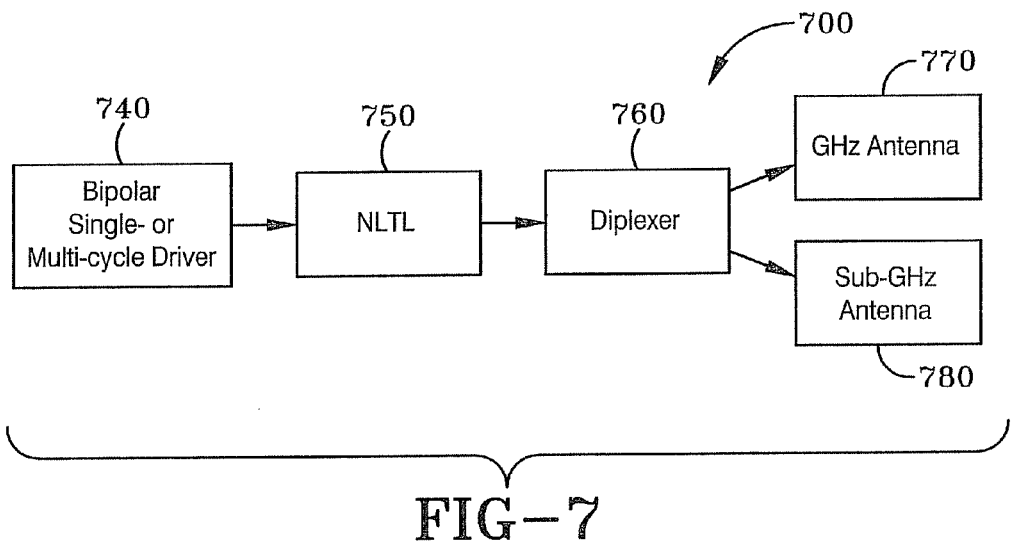
FIG. 7 illustrates another embodiment of the preferred embodiment with a diplexer connected to two antennas that have different frequency bands.

FIG. 7 illustrates the preferred embodiment configured as a system 700 in which two different frequency bands are separated by diplexer 760 and could be used by different antennas 770, 780 for their specific purposes. In this figure, a bipolar driver 740 generates single and/or multi-cycle signals similar to the generators discussed in FIGS. 3 and 4 above. This system 700 use one NLTL 750 to generate an output consisting of a trainal of oscillating bipolar signals that are sequentially positive and negative while dc and very low frequencies components are almost absent in the spectrum. The diplexer 760 separates different frequency bands present in the signal coming out of NLTL 750 and directs them towards two different output ports. These output ports are connected to antennas optimized for a specific operational frequency band. In other configurations, the multi-cycle driver 740 in this configuration can feed an array of NLTLs instead of a single NLTL 750 as illustrated in FIG. 7. For example, there may be three (or more) NLTLs as illustrated in the system 400 of FIG. 4. Furthermore, the waveform generated by the bipolar driver 740 may or may not have time delays between individual half-cycles depending on what components are used to implement the system 700.

Figure 8:
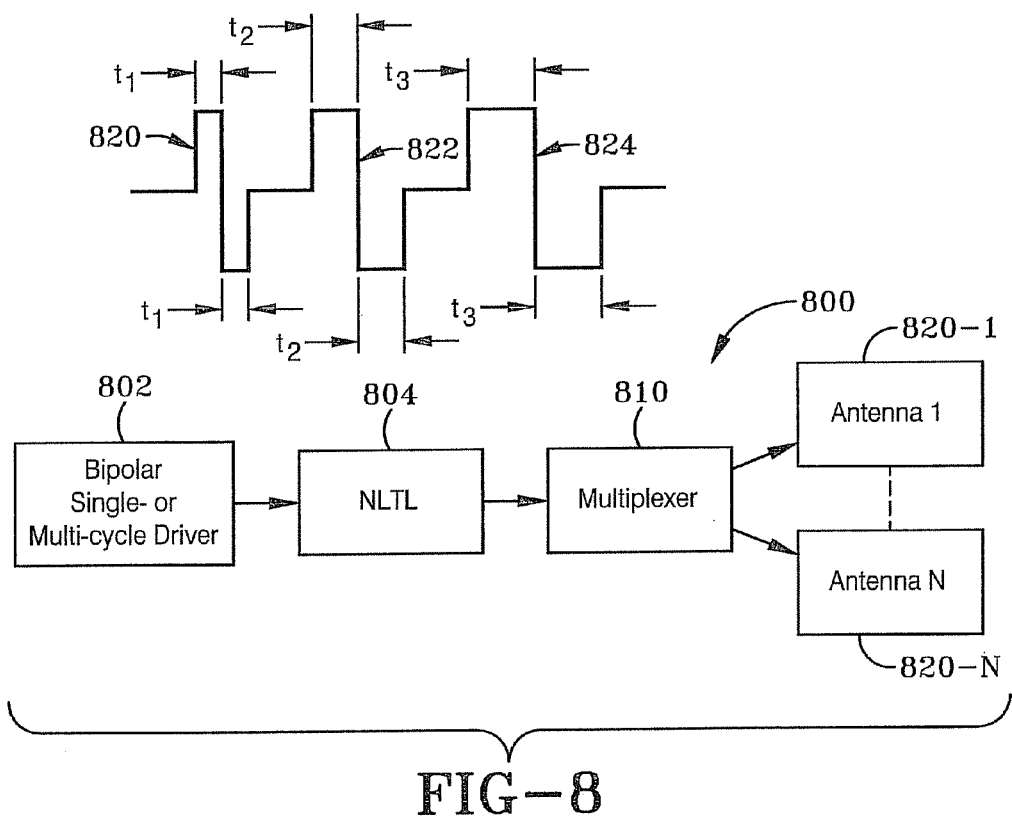
FIG. 8 illustrates another embodiment of the preferred embodiment with a multiplexer connected to a plurality antennas that can have different frequency bands.

FIG. 8 illustrates another configuration of the preferred embodiment as a system 800 with a multiplexer 810. A bipolar driver 802 generates a multi-cycle similar to the multi-cycle waveforms discussed earlier and inputs them into a NLTL 804. In this system 800, a waveform output at the output of the NLTL 804 contains different frequency components associated with different widths of the bipolar driver signal and RF modulation produced by the NLTL 804. For example, the generator 802 can generate a bipolar cycles 820, 822 and 824 with positive and negative pulse widths of $t_1$, $t_2$ and $t_3$, respectively where $t_1 < t_2 < t_3$. Of course, those of ordinary skill in the art will realize that any number of differing pulse widths can be generate and that time delays may not exist between cycles depending on how the system 800 is implemented. To separate these frequency components (bands) between antennas optimized for each particular frequency range, a multiplexer 810 can be used instead of a diplexer 760 that was illustrated in FIG. 7. The outputs of multiplexer 810 can be connected to specific antennas 820-1, 820-2 . . . 820-N. Again, the bipolar multi-cycle driver 802 in this configuration can feed an array of NLTLs instead of just single NLTL similar to the system 400 shown in FIG. 4.

Figure 9:
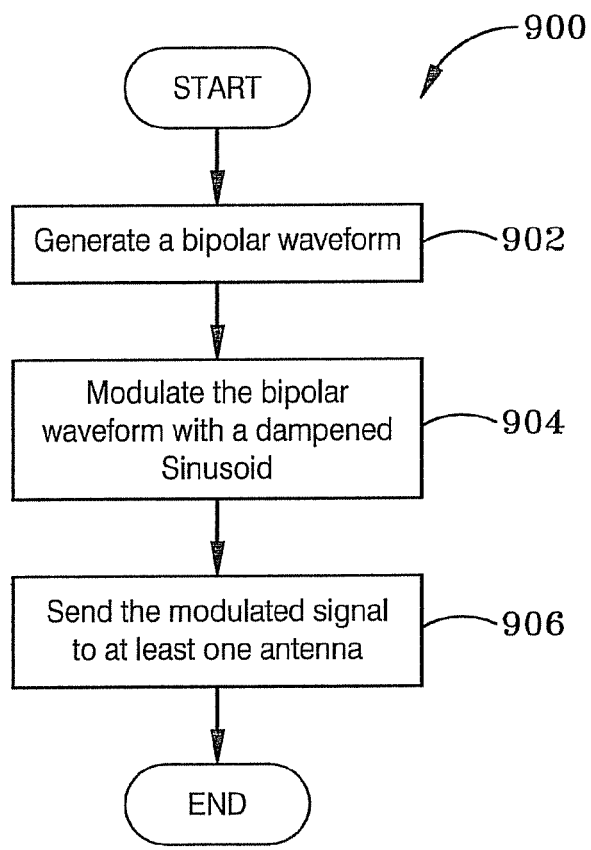
FIG. 9 illustrates the preferred embodiment configured a method for generating high power pulses.

FIG. 9 illustrates an example of the preferred embodiment configured as a method 900 of generating a high power pulse. Method 900 may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

The method 900 may generate high power microwave pulse and/or high power radio frequency pulses. The method 900 of generating a high power pulse begins by generating a bipolar waveform, at 902. This waveform may be one cycle long or may be many cycles long with each cycle being similar or having different periods and/or areas with a voltage envelope. The method 900 modulates the bipolar waveform, at 904, with an oscillating signal to create a modulated signal. The spectrum of the modulated signal contains very little to no dc components. The modulated signal is sent to at least one antenna, at 906.

In the foregoing description, certain terms have been used for brevity, clearness, and understanding. No unnecessary limitations are to be implied therefrom beyond the requirement of the prior art because such terms are used for descriptive purposes and are intended to be broadly construed. Therefore, the invention is not limited to the specific details, the representative embodiments, and illustrative examples shown and described. Thus, this application is intended to embrace alterations, modifications, and variations that fall within the scope of the appended claims.

Moreover, the description and illustration of the invention is an example and the invention is not limited to the exact details shown or described. References to "the preferred embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in the preferred embodiment" does not necessarily refer to the same embodiment, though it may.

What is claimed is:

1. A pulse generator of radio frequency or microwave signals comprising:
   a generator to generate a bipolar signal; and
   a modulator unit to modulate the bipolar signal with an oscillating signal to generate a modulated bipolar signal with oscillating portions, wherein the frequency spectrum of the modulated bipolar signal does not contain a direct current (DC) component;
   a first antenna to operate at a first bandwidth;
   a second antenna to operate at a second bandwidth; and
   a diplexer to transmit modulated bipolar signals that are to operate in the first bandwidth to the first antenna and to transmit modulated bipolar signals that are to operate in the second bandwidth to the second antenna.

2. The pulse generator of claim 1 wherein generator is configured to generate the bipolar signal that is a one cycle bipolar signal that stays at zero volts for a time period of T1, then goes from zero volts to a positive polarity for a time period of T2, then returns to zero volts for a timer period of T1, then goes to a negative polarity for a time period of T2, and then returns to zero volts for a time period of T1.

3. The pulse generator of claim 2 wherein the generator is configured to generate the bipolar signal that includes two or more of the one cycle bipolar signals generated sequentially without a time delay between the two or more of the one cycle bipolar signals.

4. A pulse generator of radio frequency or microwave signals comprising:
   a generator to generate a bipolar signal; and
   a modulator unit to modulate the bipolar signal with an oscillating signal to generate a modulated bipolar signal with oscillating portions, wherein the frequency spectrum of the modulated bipolar signal does not contain a direct current (DC) component, wherein the modulator is configured to generate a modulated bipolar signal that has a frequency spectrum with a primary frequency band and a second frequency band above a threshold, with other frequencies below the threshold.

5. The pulse generator of claim 1 wherein the modulator unit further comprises:
   a non-linear transmission line (NLTL) to modulate the bipolar signal with oscillating signals to generate the modulated bipolar signal.

6. The pulse generator of claim 1 further comprising:
   an antenna to transmit the modulated bipolar signal.

7. A pulse generator of radio frequency or microwave signals comprising:
   a generator to generate a bipolar signal; and
   a modulator unit to modulate the bipolar signal with an oscillating signal to generate a modulated bipolar signal with oscillating portions, wherein the frequency spectrum of the modulated bipolar signal does not contain a direct current (DC) component, and
   a plurality of antennas to operate at a plurality bandwidths;
   a multiplexer to transmit a modulated bipolar signal with a first bandwidth to one of the plurality of antenna configured to operate at the first bandwidth and to transmit another modulated bipolar signal with a second bandwidth to one of the plurality of antenna configured to operate at the second bandwidth.

8. A method of generating high power pulse comprising:
   generating a bipolar signal;
   modulating the bipolar signal with an oscillating signal to produce a modulated signal that does not have a DC component;
   routing the bipolar signal to a first non-linear transmission line (NLTL) wherein the first NLTL a produces the modulated signal that is a first modulated signal;
   routing the bipolar signal to a second NLTL to produce a second modulated signal; and
   transmitting the first modulated signal and the second modulated signal from two different antennas that form at least part of an antenna array.

9. The method of claim 8 wherein the modulating further comprises:
   passing the bipolar signal through a NLTL to generate the modulated bipolar signal.

10. The method of claim 8 wherein the generating further comprises:
    generating the bipolar signal that is a one cycle bipolar signal that stays at zero volts for a time period of T1, then goes from zero volts to a positive amplitude for a time period of T2, then returns to zero volts for a timer period of T1, then goes to a negative amplitude for a time period of T2, and then returns to zero volts for a time period of T1.

11. The method of claim 10 wherein generating further comprises:
    generating the bipolar signal so that the bipolar signal includes two or more of the one cycle bipolar signals generated sequentially.

12. The method of claim 8 wherein the generating further comprises:
    generating the bipolar signal that is a one cycle bipolar signal that goes to generally a positive voltage of V for a time period of T and then goes to a generally negative voltage of V for a time period of T.

13. The method of claim 12 wherein generating further comprises:
    generating the bipolar signal so that the bipolar signal includes two or more of the one cycle bipolar signals generated sequentially without a time delay between the two or more of the one cycle bipolar signals.

14. A high power pulse system comprising:
    a generator to generate a bipolar signal;
    a plurality of non-linear transmission lines (NLTLs) to modulate the bipolar signal into a plurality of modulated signals with oscillating signals, wherein the plurality of modulated signals have no DC signal components; and
    a plurality antennas forming an antenna array, wherein the plurality of antennas transmit the plurality of modulated signals.

15. The high power pulse system of claim 14 further comprising:

series to parallel interconnect to route the bipolar signal to the plurality of NLTLs.

16. The high power pulse system of claim 14 wherein generator is configured to generate the bipolar signal that stays at zero volts for a time period of T1, then goes from zero volts to a positive voltage amplitude for a time period of T2, then returns to zero volts for a timer period of T1, then goes to a negative voltage amplitude for a time period of T2, and then returns to zero volts for a time period of T1.

17. The high power pulse system of claim 14 wherein the generator is configured to be activated by at least one of the group of: spark gaps and solid state switches.

18. The high power pulse system of claim 14 where the plurality of NLTLs are comprised, at least in part, of coaxial arrangement.

* * * * *